(12) United States Patent
Kim

(10) Patent No.: US 9,245,937 B2
(45) Date of Patent: Jan. 26, 2016

(54) THIN FILM TRANSISTOR SUBSTRATES, DISPLAY DEVICES AND METHODS OF MANUFACTURING DISPLAY DEVICES

(71) Applicant: SAMSUNG DISPLAY CO., LTD., Yongin, Gyeonggi-Do (KR)

(72) Inventor: Jae-Sik Kim, Hwaseong-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/461,669

(22) Filed: Aug. 18, 2014

(65) Prior Publication Data

US 2015/0102317 A1    Apr. 16, 2015

(30) Foreign Application Priority Data

Oct. 15, 2013   (KR) .................. 10-2013-0122664

(51) Int. Cl.

| | |
|---|---|
| *H01L 29/08* | (2006.01) |
| *H01L 27/32* | (2006.01) |
| *H01L 29/786* | (2006.01) |
| *H01L 51/00* | (2006.01) |
| *H01L 51/05* | (2006.01) |
| *H01L 51/10* | (2006.01) |

(52) U.S. Cl.
CPC ........ *H01L 27/3276* (2013.01); *H01L 29/7869* (2013.01); *H01L 51/0017* (2013.01); *H01L 51/0021* (2013.01); *H01L 51/0545* (2013.01); *H01L 51/107* (2013.01)

(58) Field of Classification Search
USPC ...................................... 257/40, 43; 438/149
See application file for complete search history.

(56) References Cited

U.S. PATENT DOCUMENTS

| | | | |
|---|---|---|---|
| 5,796,116 A * | 8/1998 | Nakata et al. .................... 257/66 |
| 2010/0200843 A1* | 8/2010 | Arai et al. ....................... 257/40 |
| 2011/0015404 A1* | 1/2011 | Koch .......................... 548/266.2 |
| 2011/0031491 A1* | 2/2011 | Yamazaki et al. .............. 257/43 |
| 2011/0057186 A1* | 3/2011 | Yamazaki et al. .............. 257/43 |
| 2011/0220888 A1 | 9/2011 | Choi et al. |
| 2012/0104384 A1 | 5/2012 | Choi et al. |

FOREIGN PATENT DOCUMENTS

| | | |
|---|---|---|
| KR | 10-1050466 B1 | 7/2011 |
| KR | 10-2012-0045178 A | 5/2012 |
| KR | 10-2013-0032082 A | 4/2013 |
| KR | 10-2013-0074979 A | 7/2013 |

* cited by examiner

*Primary Examiner* — Shaun Campbell
(74) *Attorney, Agent, or Firm* — Lee & Morse, P.C.

(57) ABSTRACT

A thin film transistor substrate may include a gate electrode on a base substrate, a gate insulation layer covering the gate electrode on the base substrate, an active pattern on the gate insulation layer, an etch-stop layer pattern partially exposing the active pattern, a source electrode and a drain electrode in contact with a portion of the exposed active pattern, and an inorganic barrier layer on the source electrode, the drain electrode, and the etch-stop layer pattern. The active pattern may be superimposed over the gate electrode. The source electrode and the drain electrode may be superimposed over both ends of the gate electrode. The inorganic barrier layer may be in contact with a remaining portion of the exposed active pattern.

14 Claims, 12 Drawing Sheets

THIN FILM TRANSISTOR SUBSTRATES, DISPLAY DEVICES AND METHODS OF MANUFACTURING DISPLAY DEVICES

CROSS-REFERENCE TO RELATED APPLICATION

Korean Patent Application No. 10-2013-0122664, filed on Oct. 15, 2013, in the Korean Intellectual Property Office, and entitled: "Thin Film Transistor Substrates, Display Devices And Methods Of Manufacturing Display Devices," is incorporated by reference herein in its entirety.

BACKGROUND

1. Field

Example embodiments relate to thin film transistor substrates, display devices and methods of manufacturing display devices. More particularly, example embodiments relate to thin film transistor substrates having a bottom gate structure, display devices including the thin film transistor substrate and methods of manufacturing display devices including the thin film transistor substrate.

2. Description of the Related Art

A thin film transistor (TFT) having a bottom gate structure may include a gate electrode formed on a substrate, a gate insulation layer formed on the gate electrode, an active layer formed on the gate insulation layer and overlapping with the gate electrode, and source and drain electrodes contacting the active layer.

SUMMARY

A thin film transistor substrate may include a gate electrode on a base substrate, the gate electrode including at least two ends; a gate insulation layer covering the gate electrode on the base substrate; an active pattern on the gate insulation layer, the active pattern being superimposed over the gate electrode; an etch-stop layer pattern partially exposing the active pattern; a source electrode and a drain electrode in contact with a portion of the exposed active pattern, the source electrode and the drain electrode being superimposed over both ends of the gate electrode; and an inorganic barrier layer on the source electrode, the drain electrode, and the etch-stop layer pattern, the inorganic barrier layer being in contact with a remaining portion of the exposed active pattern.

The active pattern may include an oxide semiconductor.

The inorganic barrier layer may include a metal oxide, a silicon oxide, or a combination thereof.

The inorganic barrier layer may include aluminum oxide, titanium oxide, or a combination thereof.

The etch-stop layer pattern may include contact holes partially exposing the active pattern, and the etch-stop layer pattern may be divided into a central portion and a peripheral portion by the contact holes.

The source electrode and the drain electrode may be on the peripheral portions of the etch-stop layer pattern and may partially fill the contact holes.

The source electrode and the drain electrode may not be superimposed on the central portion of the etch-stop layer pattern.

The active pattern may include a protruding portion overlapping with the gate electrode and a planar portion that may be lower than the protruding portion.

The source electrode and the drain electrode may be in contact with lateral surfaces of the protruding portion, and the source electrode and the drain electrode may not be in contact with a top surface of the protruding portion.

The etch-stop layer pattern may have an island shape overlapping with the gate electrode.

The etch-stop layer pattern may include a central portion and a peripheral portion, the central portion and the peripheral portion may be separated from each other to define an opening between the central portion and the peripheral portion, and the opening may partially expose the active pattern.

The inorganic barrier layer may have a thickness ranging from about 50 Å to about 200 Å.

A display device may include a gate electrode on a base substrate, the gate electrode including at least two ends; a gate insulation layer covering the gate electrode on the base substrate; an active pattern on the gate insulation layer, the active pattern being superimposed over the gate electrode; an etch-stop layer pattern partially exposing the active pattern; a source electrode and a drain electrode in contact with a portion of the exposed active pattern, the source electrode and the drain electrode being superimposed over both ends of the gate electrode; and an inorganic barrier layer on the source electrode, the drain electrode and the etch-stop layer pattern, the inorganic barrier layer being in contact with a remaining portion of the exposed active pattern; a planarization layer on the inorganic barrier layer; a first electrode electrically connected to the drain electrode through the planarization layer and the inorganic barrier layer; an organic light emitting layer on the first electrode; and a second electrode on the organic light emitting layer.

The etch-stop layer pattern may include contact holes or openings partially exposing the active pattern.

The source electrode and the drain electrode may partially fill the contact holes or the openings.

The inorganic barrier layer may fill a remaining portion of the contact holes or the openings.

A method of manufacturing a display device may include forming a gate electrode on a base substrate, the gate electrode including at least two ends; forming a gate insulation layer covering the gate electrode on the base substrate; forming an active pattern on the gate insulation layer, the active pattern being superimposed over the gate electrode; forming an etch-stop layer pattern partially covering the active pattern; forming a source electrode and a drain electrode in contact with a portion of the active pattern exposed by the etch-stop layer pattern, the source electrode and the drain electrode being superimposed over both ends of the gate electrode; forming an inorganic barrier layer on the source electrode, the drain electrode and the etch-stop layer pattern, the inorganic barrier layer being in contact with a remaining portion of the exposed active pattern; forming a planarization layer on the inorganic barrier layer; forming a first electrode on the planarization layer, the first electrode being electrically connected to the drain electrode through the planarization layer and the inorganic barrier layer; forming an organic light emitting layer on the first electrode; and forming a second electrode on the organic light emitting layer.

Forming the etch-stop layer pattern may include forming an etch-stop layer covering the active pattern on the gate insulation layer, and partially etching the etch-stop layer to form contact holes or openings partially exposing the active pattern.

Forming the source electrode and the drain electrode may includes forming a first conductive layer filling the contact holes or the openings on the etch-stop layer pattern, and partially removing a portion of the first conductive layer formed in the contact holes or the openings.

Forming the first electrode may include partially removing the planarization layer by an exposure process and a developing process to form a preliminary via hole, removing a portion of the inorganic barrier layer exposed by the preliminary via hole to form a via hole exposing the drain electrode, forming a second conductive layer on the planarization layer, sidewalls of the via hole, and a bottom surface of the via hole, patterning the second conductive layer.

BRIEF DESCRIPTION OF THE DRAWINGS

Features will become apparent to those of ordinary skill in the art by describing in detail exemplary embodiments with reference to the attached drawings in which:

FIGS. 1A to 21 represent non-limiting, example embodiments as described herein:

FIG. 1A illustrates a top plan view illustrating a TFT substrate in accordance with exemplary embodiments;

FIGS. 2 to 7 illustrate cross-sectional views illustrating a method of manufacturing the TFT substrate of FIGS. 1A and 1B;

FIG. 8 illustrates a cross-sectional view illustrating a TFT substrate in accordance with exemplary embodiments;

FIGS. 9 to 13 illustrate cross-sectional views illustrating a method of manufacturing the TFT substrate of FIG. 8;

FIG. 16 illustrates a cross-sectional view illustrating a display device in accordance with example embodiments; and FIGS. 17 to 21 illustrate cross-sectional views illustrating a method of manufacturing a display device in accordance with example embodiments.

DETAILED DESCRIPTION

Figure 1A:
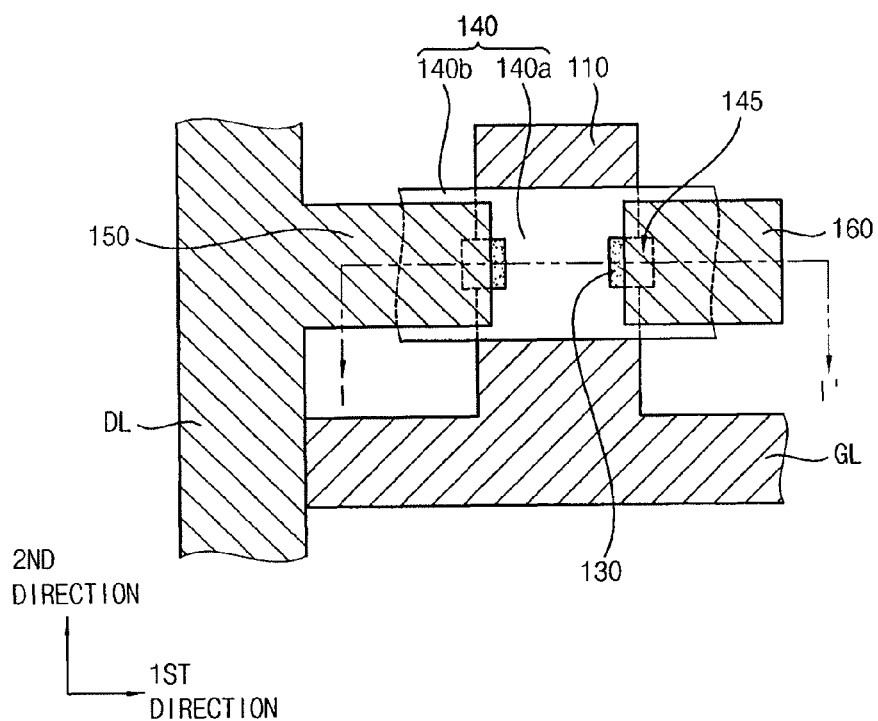

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). Like reference numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
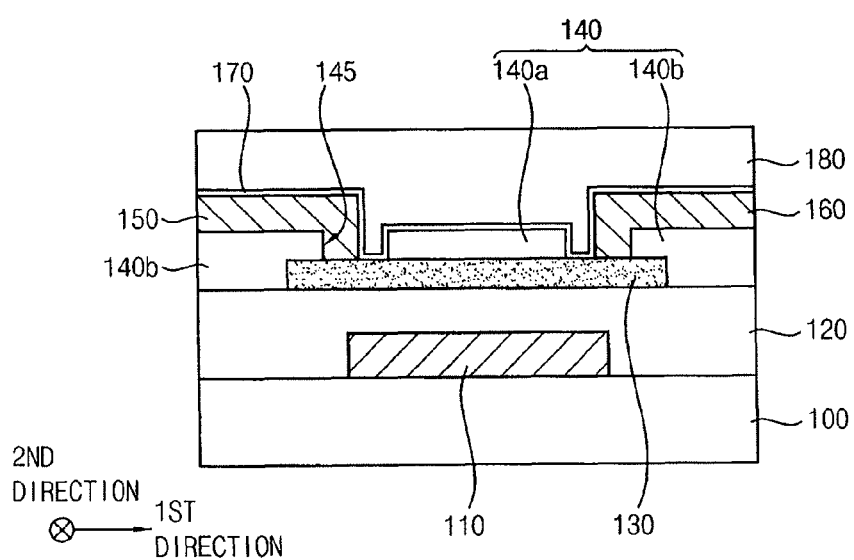
FIG. 1B illustrates a cross-sectional view taken along a line I-I' of FIG. 1A.

FIG. 1A illustrates a top plan view illustrating a TFT substrate in accordance with exemplary embodiments. FIG. 1B illustrates a cross-sectional view taken along a line I-I' of FIG. 1A.

For convenience of explanation, some elements of the TFT substrate may be omitted in FIG. 1A. For example, FIG. 1A illustrates a data line, a gate line, a gate electrode, an etch-stop layer, an active pattern, a contact hole, a source electrode and a drain electrode.

In FIGS. 1A and 1B, two directions substantially parallel to a top surface of a base substrate and substantially perpendicular to each other are referred to as a first direction and a second direction. The definition of the directions is commonly applied substantially throughout all the descriptions.

Referring to FIGS. 1A and 1B, the TFT substrate may include a gate electrode 110, a gate insulation layer 120, an active pattern 130, an etch-stop layer pattern 140, a source electrode 150, a drain electrode 160 and an inorganic barrier layer 170 disposed on a base substrate 100.

The base substrate 100 may include a transparent insulation substrate 100. For example, a glass substrate, a transparent plastic substrate, or a transparent metal oxide substrate may be used as the base substrate 100.

In one example embodiment, a buffer layer (not illustrated) may be formed on the base substrate 100. The buffer layer may prevent impurities from being diffused to the base substrate 100 and may improve flatness throughout the substrate base substrate 100. Further, the buffer layer may reduce a stress that may be generated during a formation of the gate electrode 110. The buffer layer may include, for example, silicon oxide (SiOx), silicon nitride (SiNx) or silicon oxynitride (SiOxNy).

The gate electrode 110 may be disposed on the base substrate 100, and the gate insulation layer 120 covering the gate electrode 110 may be formed on the base substrate 100.

The gate electrode 110 may have a substantially rectangular cross section as illustrated in FIG. 1B. However, the gate electrode 110 may have a substantially trapezoidal cross section.

The gate electrode 110 may include a metal, an alloy, or a metal nitride. For example, the gate electrode 110 may include a metal such as aluminum (Al), silver (Ag), tungsten (W), copper (Cu), nickel (Ni), chrome (Cr), molybdenum (Mo), titanium (Ti), platinum (Pt), tantalum (Ta), neodymium (Nd) and scandium (Sc), an alloy thereof, or a nitride thereof. Alternatively, the gate electrode 110 may include a transparent conductive material such as indium tin oxide (ITO), zinc tin oxide (ZTO), indium zinc oxide (IZO) or aluminum doped zinc oxide (AZO). The gate electrode 110 may have a single-layered structure or a multi-layered structure including at least two materials among the metal, the alloy, the metal nitride, and the transparent conductive material.

The gate electrode 110 may be integrally formed with a gate line GL and may include the same material as that of the gate line GL. As illustrated in FIG. 1A, the gate line GL may extend in the first direction, and the gate electrode 110 may protrude from the gate line GL in the second direction.

The gate insulation layer 120 may include an insulation material such as silicon oxide, silicon nitride or silicon oxynitride. The gate insulation layer 120 may have a single-layered structure or a multi-layered structure. For example, the gate insulation layer 120 may have a multi-stacked structure including a silicon oxide layer and a silicon oxynitride layer.

In example embodiments, the gate insulation layer 120 may have a substantially even or leveled upper surface.

The active pattern 130 may be disposed on the gate insulation layer 120 to be superimposed over the gate electrode 110. As illustrated in FIG. 1B, the active pattern 130 may have a sufficient width to fully cover the gate electrode 110.

In example embodiments, the active pattern 130 may include an oxide semiconductor. The oxide semiconductor may include a binary compound (ABx), a ternary compound (ABxCy) or a quaternary compound (ABxCyDz) including indium (In), zinc (Zn), gallium (Ga), tin (Sn), titanium (Ti), aluminum (Al), hafnium (Hf), zirconium (Zr), magnesium (Mg), or the like. For example, the oxide semiconductor may include indium gallium zinc oxide (IGZO), indium tin oxide (ITZO), gallium zinc oxide (GaZnxOy), zinc magnesium oxide (ZnMgxOy), zinc zirconium oxide (ZnZrxOy), zinc oxide (ZnOx), gallium oxide (GaOx), tin oxide (SnOx), indium oxide (InOx), indium gallium hafnium oxide (IGHO), tin aluminum zinc oxide (TAZO), indium gallium tin oxide (IGSO), or the like. These may be present alone or in a combination. In one example embodiment, the oxide semiconductor may further include at least one dopant including lithium (Li), sodium (Na), manganese (Mn), nickel (Ni), palladium (Pd), copper (Cu), carbon (C), nitrogen (N), phosphorus (P), titanium (Ti), zirconium (Zr), vanadium (V), ruthenium (Ru), germanium (Ge), tin (Sn), fluorine (F), or the like.

The etch-stop layer pattern 140 may be disposed on the gate insulation layer 120 to partially cover the active pattern 130. The etch-stop layer pattern 140 may include a contact hole 145 partially exposing the active pattern 130. In example embodiments, the etch-stop layer pattern 140 may include a pair of the contact holes 145.

In example embodiments, a portion of the etch-stop layer pattern 140 between the contact holes 145 may be defined as a central portion 140a. The central portion 140a may be substantially superimposed over the gate electrode 110. Portions of the etch-stop layer pattern 140 which cover both ends of the active pattern 130 may be defined peripheral portions 140b. As illustrated in FIG. 1A, the central portion 140a and the peripheral portion 140b may be merged or connected around the contact hole 145.

The etch-stop layer pattern 140 may include, e.g., silicon oxide, silicon nitride, or silicon oxynitride.

The source electrode 150 and the drain electrode 160 may be disposed on the peripheral portions 140b of the etch-stop layer pattern 140 to be in contact with the active pattern 130. In example embodiments, the source and drain electrodes 150 and 160 may partially fill the contact holes 145. Thus, the active pattern 130 may be exposed by a remaining portion of the contact hole 145. The source and drain electrodes 150 and 160 may be superimposed over both ends of the gate electrode 110. However, the source and drain electrodes 150 and 160 may not be superimposed on the central portion 140a of the etch-stop layer pattern 140.

The source and drain electrodes 150 and 160 may include a metal such as Al, Cu, Mo or Ti, or an alloy of the metals. Alternatively, the source and drain electrodes 150 and 160 may include a transparent conductive material such as ITO, IZO or AZO. The source and drain electrodes 150 and 160 may have a single-layered structure or a multi-layered structure including a plurality of metal layers and/or transparent conductive layers.

As illustrated in FIG. 1A, the source electrode 150 may be integrally formed with a data line DL and may include substantially the same material as that of the data line DL. For example, the data line DL may extend in the second direction and the source electrode 150 may protrude from the data line DL in the first direction. The source electrode 150 and the drain electrode 160 may face each other along the first direction with respect to the central portion 140a of the etch-stop layer pattern 140.

A plurality of the data lines DL and the gate lines GL may be arranged in the first direction and the second direction, respectively. The data lines DL may cross over the gate lines GL so that a pixel region of a display device including the TFT substrate may be defined by an intersection region of the data lines DL and the gate lines GL.

A TFT may be defined by the source electrode 150, the drain electrode 160, the gate electrode 110, the gate insulation layer 120, and the active pattern 130.

The inorganic barrier layer 170 may be formed on the source electrode 150, the drain electrode 160, the central portion 140a of the etch-stop layer pattern 140, and the active pattern 130 exposed by the contact hole 145.

The inorganic barrier layer 170 may include an inorganic material, e.g., a metal oxide or silicon oxide. In example embodiments, the inorganic barrier layer 170 may include aluminum oxide (AlOx) or titanium oxide (TiOx).

In example embodiments, a thickness of the inorganic barrier layer 170 may range from about 50 Å to about 200 Å. When the thickness of the inorganic barrier layer 170 is less than about 50 Å, the inorganic barrier layer 170 may not have a uniform thickness. When the thickness of the inorganic barrier layer 170 exceeds about 200 Å, the inorganic barrier layer 170 may not be easily etched during a process for manufacturing a display device including the TFT substrate.

A planarization layer 180 may be formed on the inorganic barrier layer 170. The barrier layer 180 may fill a remaining portion of the contact hole 145. The planarization layer 180 may include a transparent organic material, e.g., an acryl-based resin, a polyimide-based resin, a siloxane-based resin, benzo cyclobutene (BCB) or the like. In example embodiments, the planarization layer 180 may serve as a via layer for forming a pixel electrode of the display device.

According to example embodiments, the source and drain electrodes 150 and 160 may partially fill the contact holes 145, and the active pattern 130 may be partially exposed by the contact holes 145. Thus, overlapping areas between the gate electrode 110 and the source electrode 150 and between the gate electrode 110 and the drain electrode 160 may be minimized. Therefore, a parasitic capacitance generated between the electrode structures may also be minimized. Additionally, the active pattern 130 may include an expanded channel length defined between the source electrode 150 and the drain electrode 160, so that a width or a length of the TFT may be reduced.

However, in the case that the planarization layer 180 is formed directly on the source electrode 150, the drain electrode 160, and the etch-stop layer pattern 140, the planarization layer may make direct contact with the active pattern 130. When the active pattern 130 includes the oxide semiconductor and the planarization layer 180 includes the above organic material, a moisture and/or a functional group such as a hydroxyl group included in the organic material may be reacted with the oxide semiconductor to cause a modification of the oxide semiconductor and/or an outgassing from the planarization layer 180.

According to example embodiments, the inorganic barrier layer 170 may prevent a direct contact between the planarization layer 170 and the active pattern 130. Thus, side effects described above, e.g., the modification of the oxide semiconductor and the outgassing from the planarization layer 180 may not occur so that the TFT substrate and the display device may have enhanced operational reliability.

Additionally, the inorganic barrier layer 170 may cover the active pattern 130, the source electrode 150 and the drain electrode 160, so that the planarization layer 180 may be formed directly on the inorganic barrier layer 70 without forming an additional passivation layer. Thus, additional mask and/or deposition processes for forming the passivation layer may be omitted.

FIGS. 2 to 7 illustrate cross-sectional views illustrating a method of manufacturing the TFT substrate of FIGS. 1A and 1B.

Figure 2:
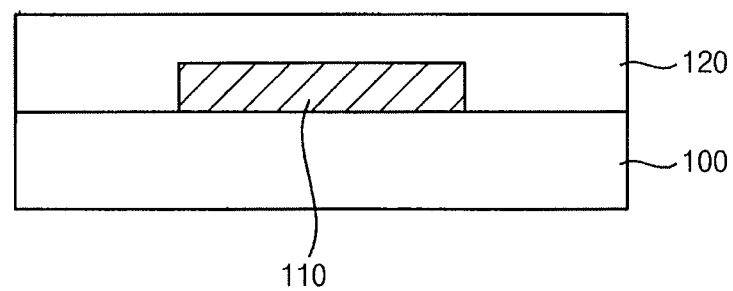

Referring to FIG. 2, a gate electrode 110 may be formed on a base substrate 100 and a gate insulation layer 120 covering the gate electrode 110 may be formed on the base substrate 100.

The base substrate 100 may include a transparent insulation substrate. For example, a glass substrate, a transparent plastic substrate or a transparent metal oxide substrate may be used as the base substrate 100.

A first conductive layer may be formed on the base substrate 100, and then the first conductive layer may be patterned to obtain the gate electrode 110. The first conductive layer may be formed to include a metal such as Al, Ag, W, Cu, Ni, Cr, Mo, Ti, Pt, Ta, Nd or Sc, an alloy of these metals, or the nitride of these metals. Alternatively, the first conductive layer may be formed using a transparent conductive layer such as ITO, IZO or AZO. The first conductive layer may be formed to have a single-layered structure or a multi-layered structure including at least two materials among the metal, the alloy, the metal nitride and the transparent conductive material. The first conductive layer may be obtained by a sputtering process, an atomic layer deposition (ALD) process, a pulse laser deposition (PLD) process, or a vacuum evaporation process, etc.

The gate electrode 110 may be patterned together with the gate line GL as illustrated in FIG. 1A. In the case that the gate line GL extends in the first direction, the gate electrode 110 may be patterned to protrude from the gate line GL in the second direction.

In one example embodiment, a buffer layer (not illustrated) may be formed on the base substrate 100 prior to forming the gate electrode 110.

The gate insulation layer 120 may be formed to include silicon oxide, silicon nitride or silicon oxynitride. The gate insulation layer 120 may be formed to include a single-layered structure or a multi-layered structure including, e.g., a silicon oxide layer and a silicon oxynitride layer. The gate insulation layer 120 may be formed by a chemical vapor deposition (CVD) process, a plasma enhanced vapor deposition (PECVD) process, a spin coating process, a vacuum evaporation process, etc.

In example embodiments, the gate insulation layer 120 may have a sufficient thickness to include a substantially even or leveled upper surface.

Figure 3:
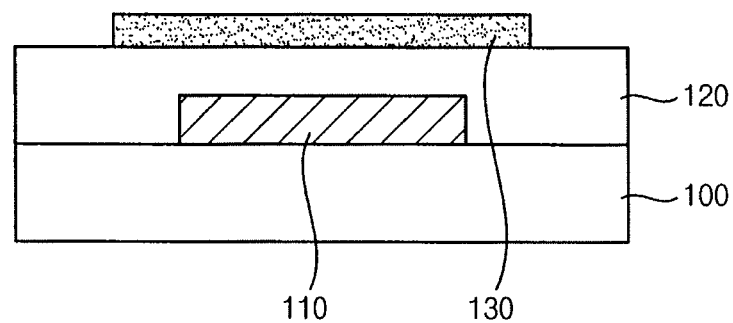

Referring to FIG. 3, an active pattern 130 may be formed on the gate insulation layer 120.

In example embodiments, an oxide semiconductor layer may be formed on the gate insulation layer 120, and then the oxide semiconductor layer may be patterned by, e.g., a photolithography process to form the active pattern 130. The active pattern 130 may have a sufficient width to fully cover the gate electrode 110.

The oxide semiconductor layer may be formed using a binary compound, a ternary compound, or a quaternary compound such as IGZO, ITZO, GaZnxOy, ZnMgxOy, ZnSnxOy, ZnZrxOy, ZnOx, GaOx, SnOx, InOx, IGHO, TAZO, IGSO, or the like. In exemplary embodiments, at least one dopants including Li, Na, Mn, Ni, Pd, Cu, C, N, P, Ti, Zr, V, Ru, Ge, Sn, F, or the like may be implanted into the oxide semiconductor layer. The oxide semiconductor layer may be formed by an ALD process, a sputtering process, or a PLD process, etc.

In one example embodiment, a plasma treatment may be further performed on the active pattern 130. An etching damage generated during the patterning process of the oxide semiconductor layer may be repaired by the plasma treatment. The plasma treatment may be performed in an atmosphere including O2, H2O, N2O, etc. The plasma treatment may be performed in an atmosphere including O2, and an inert gas. Cl2 and/or CF4 may be added into the atmosphere.

Figure 4:
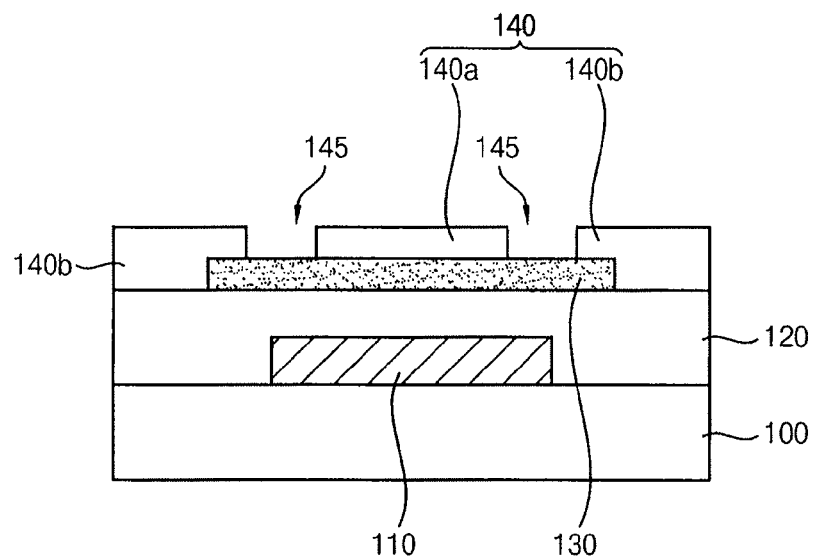

Referring to FIG. 4, an etch-stop layer pattern 140 partially covering the active pattern 130 may be formed on the gate insulation layer 120.

In example embodiments, an etch-stop layer covering the active pattern 130 may be formed on the gate insulation layer 120, and then a first photo mask (not illustrated) may be formed on the etch-stop layer. The etch-stop layer may be partially removed using the first photo mask to obtain the etch-stop layer pattern 140. The etch-stop layer may be formed using an insulation material such as silicon oxide, silicon nitride or silicon oxynitride by a CVD process, a PECVD process, or a spin coating process, etc.

The etch-stop layer pattern 140 may include a contact hole 145 partially exposing the active pattern 130. In example embodiments, a pair of the contact holes 145 may be formed in the etch-stop layer pattern 140. The contact hole 145 may be partially superimposed over the gate electrode 110.

In example embodiments, the etch-stop layer pattern 140 may be divided into a central portion 140a and a peripheral portion 140b. A portion of the etch-stop layer pattern 140 between the contact holes 145 may be defined as the central portion 140a. The central portion 140a may be substantially superimposed over the gate electrode 110. Portions of the etch-stop layer pattern 140 covering both ends of the active pattern 130 may be defined as the peripheral portions 140b. The central portion 140a and the peripheral portion 140b may be merged with or connected to each other around the contact hole 145.

Figure 5:
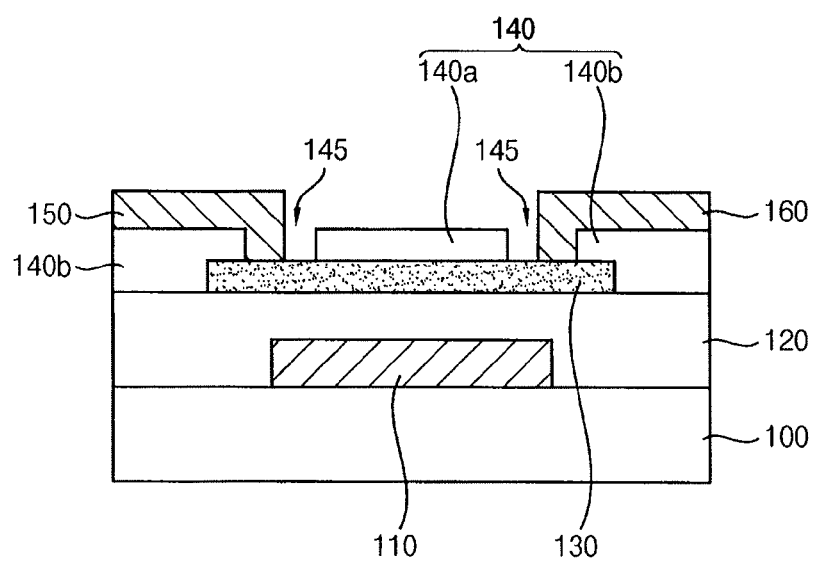

Referring to FIG. 5, a source electrode 150 and a drain electrode 160 partially filling the contact holes 145 may be formed. The source and drain electrodes 150 and 160 may be in contact with the active pattern 130.

In example embodiments, a second conductive layer filling the contact holes 145 may be formed on the etch-stop layer pattern 140 and the active pattern 130. A second photo mask (not illustrated) covering the peripheral portions 140b of the etch-stop layer pattern 140 and portions of the contact holes 145 may be formed on the second conductive layer. The second conductive layer may be patterned using the second photo mask to obtain the source electrode 150 and the drain electrode 160. The second conductive layer may be formed to include a metal such as Al, Cu, Mo or Ti, or an alloy thereof. Alternatively, the second conductive layer may be formed to include a transparent conductive material such as ITO, IZO, or AZO. The second conductive layer may have a multi-layered structure including the metal, the alloy and/or the transparent conductive material. The second conductive layer may be formed using a sputtering process, an ALD process, a PLD process, etc.

As illustrated in FIG. 5, the source and drain electrodes 150 and 160 may be formed on the peripheral portions 140b of the etch-stop layer pattern 140 to partially fill the contact holes 145. Accordingly, the active pattern 130 may be exposed by remaining portions of the contact holes 145. In example embodiments, the source and drain electrodes 150 and 160 may overlap with both ends of the gate electrode 110; however, the source and drain electrodes 150 and 160 may not overlap with the central portion 140a of the etch-stop layer pattern 140. Overlapping areas between the gate electrode 110 and the source electrode 150 and between the gate electrode 110 and the drain electrode 160 may be minimized because the source and drain electrodes 150 and 160 may not completely fill the contact holes 145. Therefore, a parasitic capacitance generated between the electrode structures may be reduced.

As illustrated in FIG. 1A, the source and drain electrodes 150 and 160 may be patterns together with a data line DL. In this case, the source electrode 150 may be integrally formed with the data line DL. The source electrode 150 and the drain electrode 160 may face each other along the first direction with respect to the central portion 140a of the etch-stop layer pattern 140. For example, the data line DL may extend in the second direction and the source electrode 150 may be patterned to protrude from the data line DL in the first direction.

Figure 6:
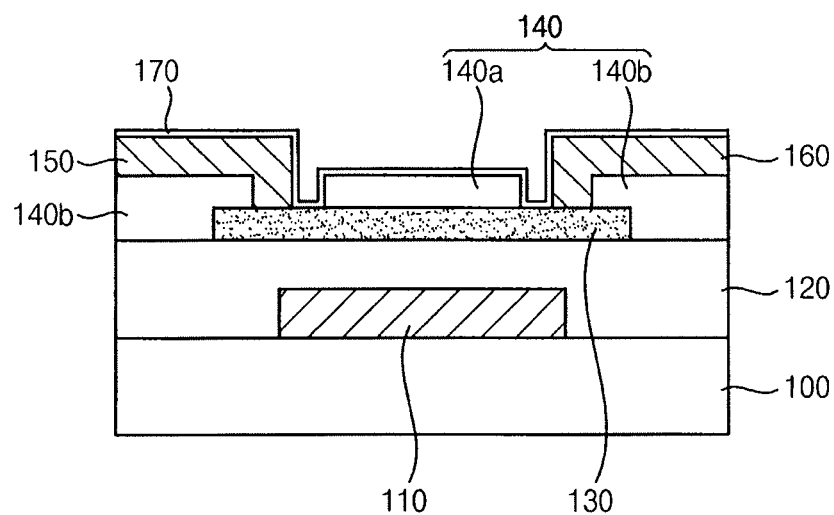

Referring to FIG. 6, an inorganic barrier layer 170 may be formed on the source electrode 150, the drain electrode 160, the central portion 140a of the etch-stop layer pattern 140 and the active pattern 130 partially exposed by the contact hole.

The inorganic barrier layer 170 may be formed using an inorganic material such as a metal oxide or silicon oxide by a sputtering process, an ALD process or a PLD process. In example embodiments, the inorganic barrier layer 170 may be formed using aluminum oxide or titanium oxide.

The inorganic barrier layer 170 may not completely fill the contact hole 145 and may be formed to have a thin and uniform thickness. In example embodiments, the inorganic barrier layer 170 may be formed to have a thickness in a range of from about 50 Å to about 200 Å. When the thickness of the inorganic barrier layer 170 is less than about 50 Å, the inorganic barrier layer 170 may not have a uniform thickness. When the thickness of the inorganic barrier layer 170 exceeds about 200 Å, the inorganic barrier layer 170 may not be easily etched during a process for manufacturing the display device including the TFT substrate. A sputtering process may be utilized in order to obtain the inorganic barrier layer 170 having the above thickness range.

Figure 7:
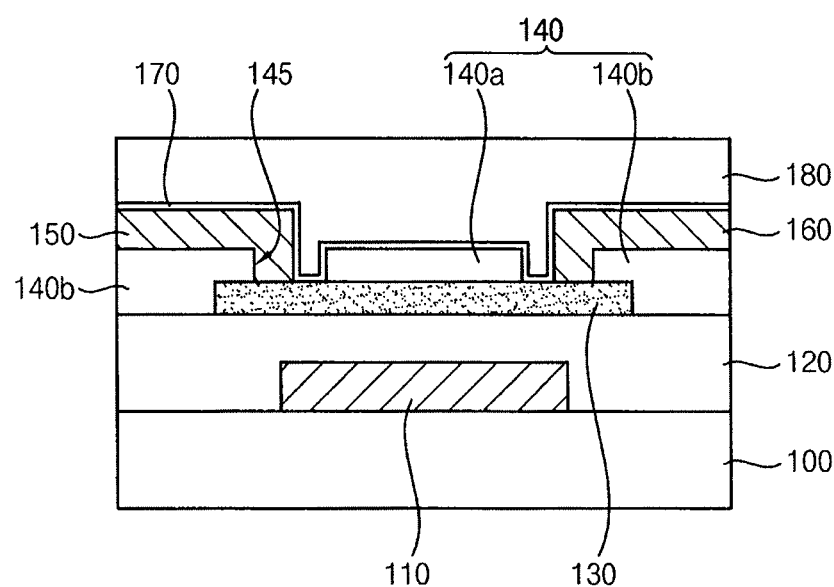

Referring to FIG. 7, a planarization layer 180 may be formed on the inorganic barrier layer 170. The planarization layer 180 may sufficiently fill the remaining portion of the contact hole 145 to have a substantially even or leveled upper surface.

In example embodiments, the planarization layer 180 may be formed using a transparent organic material such as an acryl-based resin, a polyimide-based resin, a siloxane-based resin or BCB by a CVD process, a spin coating process, or a slit coating process, etc.

As described above, a direct contact between the planarization layer 180 and the active pattern 130 may be prevented by the inorganic barrier layer 170, so that a modification of the active pattern 130 and an outgassing from the planarization layer 180 may be suppressed.

Figure 8:
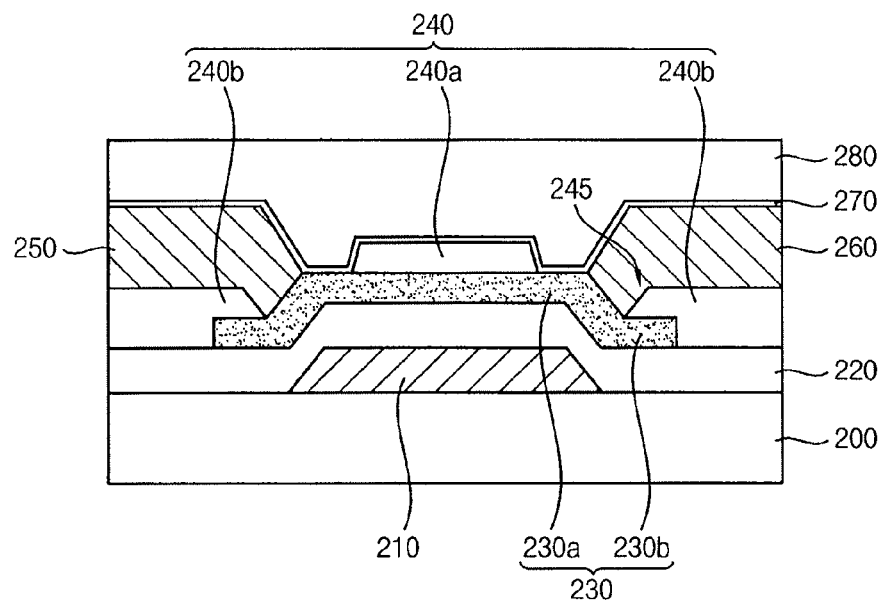

FIG. 8 illustrates a cross-sectional view illustrating a TFT substrate in accordance with exemplary embodiments. Detailed descriptions on elements and/or constructions substantially the same as or similar to those illustrated with reference to FIGS. 1A and 1B are omitted. Like reference numerals are used to represent like elements.

Referring to FIG. 8, the TFT substrate may include a gate electrode 210, a gate insulation layer 220, an active pattern 230, an etch-stop layer pattern 240, a source electrode 250, a drain electrode 260, an inorganic barrier layer 270, and a planarization layer 280.

The gate electrode 210 may be disposed on the base substrate 200 and have a substantially trapezoidal cross section.

The gate insulation layer 220 may have a thickness smaller than that of the gate insulation layer 120 illustrated in FIG. 1B. The gate insulation layer 220 may have a protruding portion corresponding to a shape of the gate electrode 210. Additionally, the gate insulation layer 220 may have a planar portion lower than the protruding portion.

The active pattern 230 may cover the protruding portion of the gate insulation layer 220 and may extend to the planar portion of the gate insulation layer 220. Accordingly, the active pattern 230 may also include a protruding portion 230a and a planar portion 230b lower than the protruding portion 230a.

The etch-stop layer pattern 240 may be formed on the gate insulation layer 220 and the active pattern 230. The etch-stop layer pattern 240 may include a central portion 240a and a peripheral portion 240b. The etch-stop layer pattern 240 may include a first contact hole 245. The central portion 240a and the peripheral portion 240b may be divided by the first contact hole 245.

In example embodiments, the central portion 240a of the etch-stop layer pattern 240 may be disposed on the protruding portion 230a of the active pattern 230 to be superimposed over the gate electrode 210. The peripheral portion 240b of the etch-stop layer pattern 240 may be disposed on the gate insulation layer 220 to cover the planar portion 230b of the active pattern 230. Accordingly, a top surface and a lateral surface of the protruding portion 230a of the active pattern 230 may be substantially exposed by the first contact hole 245.

The source electrode 250 and the drain electrode 260 may be disposed on the peripheral portions 240b of the etch-stop layer pattern 240 to be in contact with the protruding portion 230a of the active pattern 230. In example embodiments, the source electrode 250 and the drain electrode 260 may be in contact with the lateral surfaces of the protruding portion 230a. In this case, the source electrode 250 and the drain electrode 260 may substantially overlap with lateral surfaces of the gate electrode 210 and may not overlap with a top surface of the gate electrode 210. Thus, overlapping areas between the electrode structures may be minimized.

The inorganic barrier layer 270 may be formed uniformly along the source electrode 250, the drain electrode 260, the active pattern 230 partially exposed by the first contact hole 245 and the central portion 240a of the etch-stop layer pattern 240. In example embodiments, the inorganic barrier layer 270 may be in contact with the top surface of the protruding portion 230a of the active pattern 230.

The planarization layer 280 may be formed on the inorganic barrier layer 270 to fill remaining portions of the first contact holes 245.

FIGS. 9 to 13 illustrate cross-sectional views illustrating a method of manufacturing the TFT substrate of FIG. 8. Detailed descriptions on processes and/or materials substantially the same as or similar to those illustrated with reference to FIGS. 2 to 7 are omitted.

Figure 9:
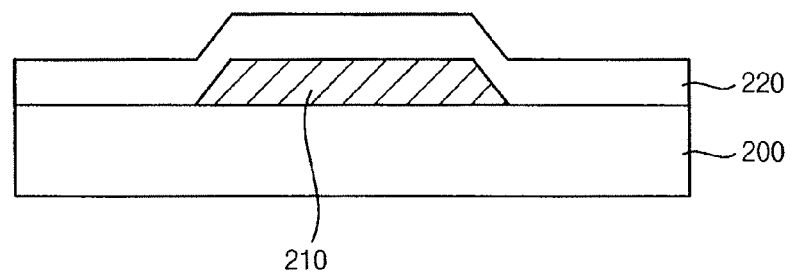

Referring to FIG. 9, a process substantially the same as or similar to that illustrated with reference to FIG. 2 may be performed to form a gate electrode 210 and a gate insulation layer 220 on a base substrate 200.

The gate electrode 210 may be formed by a dry etching process to have a substantially trapezoidal cross section.

The gate insulation layer 220 may be formed to have a thickness smaller than that of the gate insulation layer 120 illustrated in FIG. 2. The gate insulation layer 220 may have a protruding portion corresponding to a shape of the gate electrode 210. Accordingly, the gate insulation layer 220 may have the protruding portion substantially overlapping with the gate electrode 210 and a planar portion lower than the protruding portion. The planar portion may be defined as a portion of the gate insulation layer 220 formed on the base substrate 200.

Figure 10:
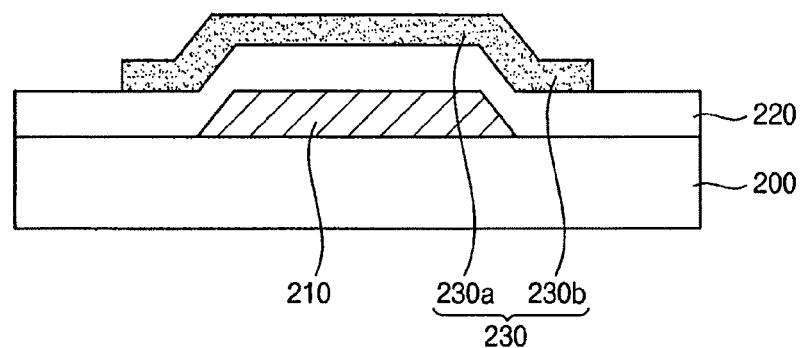

Referring to FIG. 10, a process substantially the same as or similar to that illustrated with reference to FIG. 3 may be performed to form an active pattern 230 overlapping with the gate electrode 230 on the gate insulation layer 220. The active pattern 230 may also include a protruding portion 230a substantially overlapping with the gate electrode 210 and a planar portion 230b lower than the protruding portion 230a according to a shape of the gate insulation layer 220.

Figure 11:
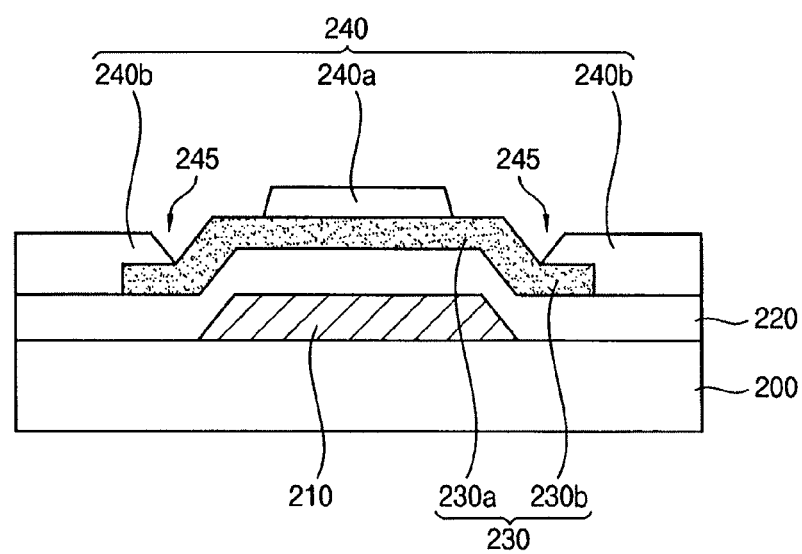

Referring to FIG. 11, a process substantially the same as or similar to that illustrated with reference to FIG. 4 may be performed to form an etch-stop layer pattern 240 partially covering the active pattern 230.

In example embodiments, the etch-stop layer pattern 240 may include a first contact hole 245 partially exposing the active pattern 230. The etch-stop layer pattern 240 may be divided into a central portion 240a and a peripheral portion 240b by the first contact hole 245. The central portion 240a of the etch-stop layer pattern 240 may be formed on the protruding portion 230a of the active pattern 230 to be superimposed over the gate electrode 210. The peripheral portion 240b of the etch-stop layer pattern 240 may be formed on the gate insulation layer 220 to cover the planar portion 230b of the active pattern 230. In this case, a top surface and a lateral surface of the protruding portion 230a of the active pattern 230 may be substantially exposed by the first contact hole 245.

Figure 12:
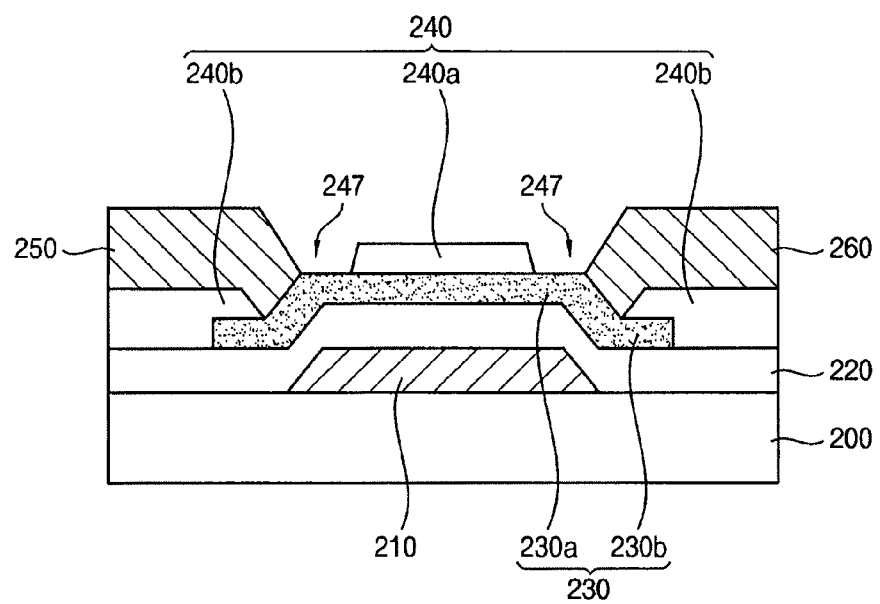

Referring to FIG. 12, a process substantially the same as or similar to that illustrated with reference to FIG. 5 may be performed to form a source electrode 250 and a drain electrode 260 on the peripheral portion 240b of the etch-stop layer pattern 240. The source and drain electrodes 250 and 260 may partially fill the first contact holes 245.

In example embodiments, a conductive layer filling the first contact hole 245 may be formed on the etch-stop layer pattern 240, and then the conductive layer may be partially etched to form the source and drain electrodes 250 and 260. In the etching process, the protruding portion 230a of the active pattern 230 may substantially serve as an etch-stopper. Accordingly, the source and drain electrodes 250 and 260 may be formed to be in contact with the lateral surfaces of the protruding portion 230a of the active pattern 230. In this case, the source and drain electrodes 250 and 260 may substantially overlap with lateral surfaces of the gate electrode 210, and may not overlap with a top surface of the gate electrode 210. Therefore, overlapping areas between the electrode structures may be minimized to reduce a generation of a parasitic capacitance.

By forming the source and drain electrodes 250 and 260 partially filling the first contact holes 245, second contact holes 247 may be defined. In example embodiments, the top surface of the protruding portion 230a of the active pattern 230 may be exposed by the second contact hole 247.

Figure 13:
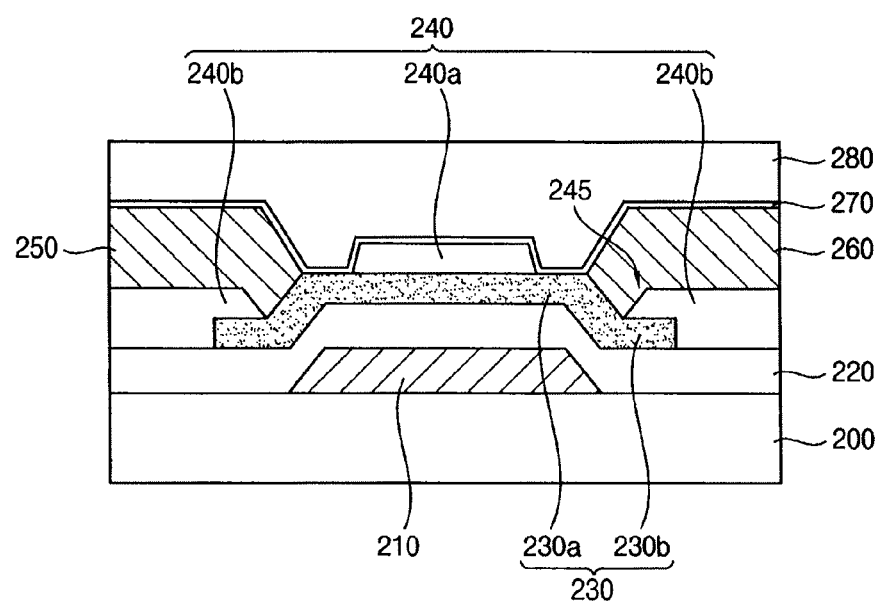

Referring to FIG. 13, processes substantially the same as or similar to those illustrated with reference to FIGS. 6 and 7 may be performed. Accordingly, an inorganic barrier layer 270 may be formed along the source electrode 250, the drain electrode 260, the central portion 240a of the etch-stop layer pattern 240 and the top surface of the protruding portion 230a exposed by the second contact hole 247. A planarization layer 280 may be formed on the inorganic barrier layer 270 to sufficiently fill the second contact hole 247.

In example embodiments, the inorganic barrier layer 270 may not extend to the lateral surface of the protruding portion 230a of the active pattern 230, and may be in contact with the top surface of the protruding portion 230a. Thus, the inorganic barrier layer 270 having a uniform thickness and a continuous profile may be easily obtained.

Figure 14A:
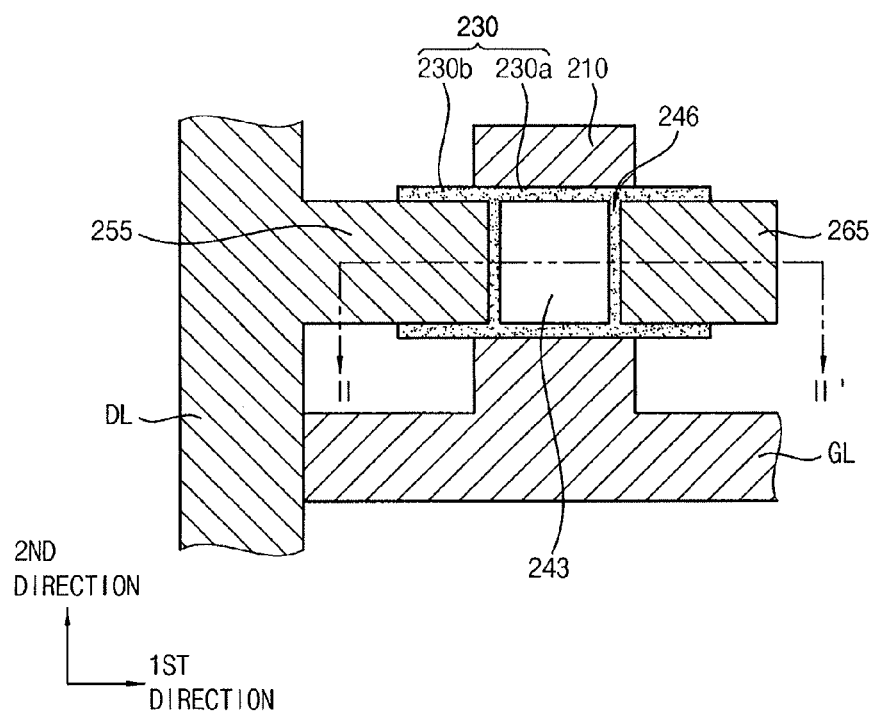
FIG. 14A illustrates a top plan view illustrating a TFT substrate in accordance with exemplary embodiments.
Figure 14B:
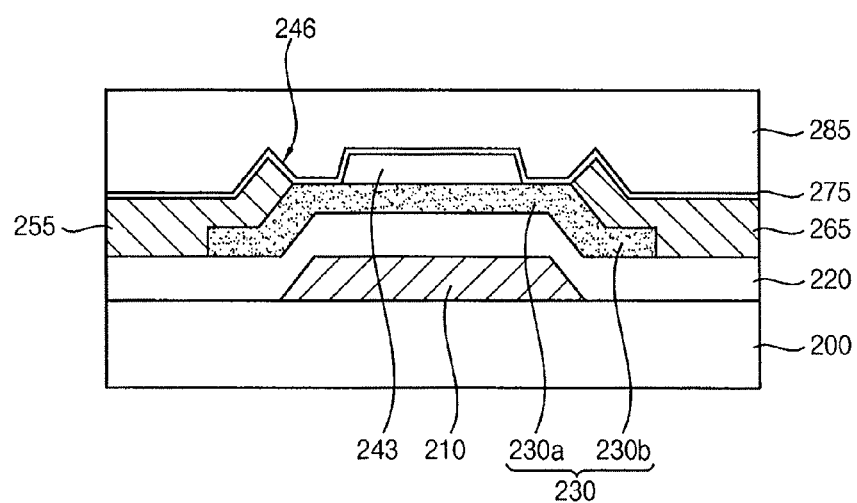
FIG. 14B illustrates a cross-sectional view taken along a line II-II' of FIG. 14A.

FIG. 14A illustrates a top plan view illustrating a TFT substrate in accordance with exemplary embodiments. FIG. 14B illustrates a cross-sectional view taken along a line II-II' of FIG. 14A.

The TFT substrate of FIGS. 14A and 14B may have a structure substantially the same as or similar to that of the TFT substrate illustrated in FIG. 8 except for a shape of an etch-stop layer pattern. Thus, detailed descriptions on elements and/or constructions substantially the same as or similar to those illustrated with reference to FIG. 8 are omitted. Further, like reference numerals are used to represent like elements. A method of manufacturing the TFT substrate is also described with reference to FIGS. 14A and 14B.

Referring to FIGS. 14A and 14B, an etch-stop layer pattern 243 may be formed on an active pattern 230 to be superimposed over a gate electrode 210, and may have a substantially island shape.

In example embodiments, processes substantially the same as or similar to those illustrated with reference to FIGS. 9 and 10 may be performed to form the gate electrode 210, a gate insulation layer 220 and the active pattern 230 on a base substrate 200. The gate insulation layer 220 and the active pattern 230 may have protruding portions according to a shape of the gate electrode 210. Alternatively, the gate insulation layer 220 and the active pattern 230 may have substantially even or leveled upper surfaces as illustrated in FIG. 1B.

An etch-stop layer covering the active pattern 230 may be formed on the gate insulation layer 220, and then the etch-stop layer may be partially etched to form the etch-stop layer pattern 243 that may be isolated on the active pattern 230.

In example embodiments, a photoresist layer (not illustrated) may be formed on the etch-stop layer, and then an exposure process may be performed from a back surface of the base substrate 200 using the gate electrode 210 as an exposure mask. A developing process may be performed to form a photoresist pattern on the etch-stop layer. The etch-stop layer may be partially removed using the photoresist pattern as an etching mask to obtain the etch-stop layer pattern 243 having a substantially island shape. In one example embodiment, the etch-stop layer pattern 243 may be obtained by a printing process.

As illustrated in FIG. 14B, in the case that the active pattern 230 includes a protruding portion 230a and a planar portion 230b, the etch-stop layer pattern 243 may be formed on the protruding portion 230a to be substantially superimposed over the gate electrode 210.

A process substantially the same as or similar to that illustrated with reference to FIG. 12 may be performed to form a source electrode 255 and a drain electrode 265. The source and drain electrodes 255 and 265 may be formed on the gate insulation layer 220 to be in contact with both ends of the active pattern 230. When the active pattern 230 includes the protruding portion 230a and the planar portion 230b, the source electrode 255 and the drain electrode 265 may extend from the planar portions 230b to lateral surfaces of the protruding portion 230a.

Openings 246 may be defined between the source electrode 255 and the etch-stop layer pattern 243 and between the drain electrode 265 and the etch-stop layer pattern 243. The active pattern 230 may be partially exposed by the openings 246. In example embodiments, the opening 246 may have a trench shape extending in the second direction. A top surface of the protruding portion 230a of the active pattern 230 may be partially exposed by the opening 246.

A process substantially the same as or similar to that illustrated with reference to FIG. 13 may be performed to form an inorganic barrier layer 275 and a planarization layer 285. The inorganic barrier layer 275 may be formed along the source electrode 255, the drain electrode 265, the etch-stop layer pattern 243 and the active pattern 230 exposed by the opening 246. A planarization layer 285 may be formed on the inorganic barrier layer 275 to sufficiently fill the opening 246.

Figure 15A:
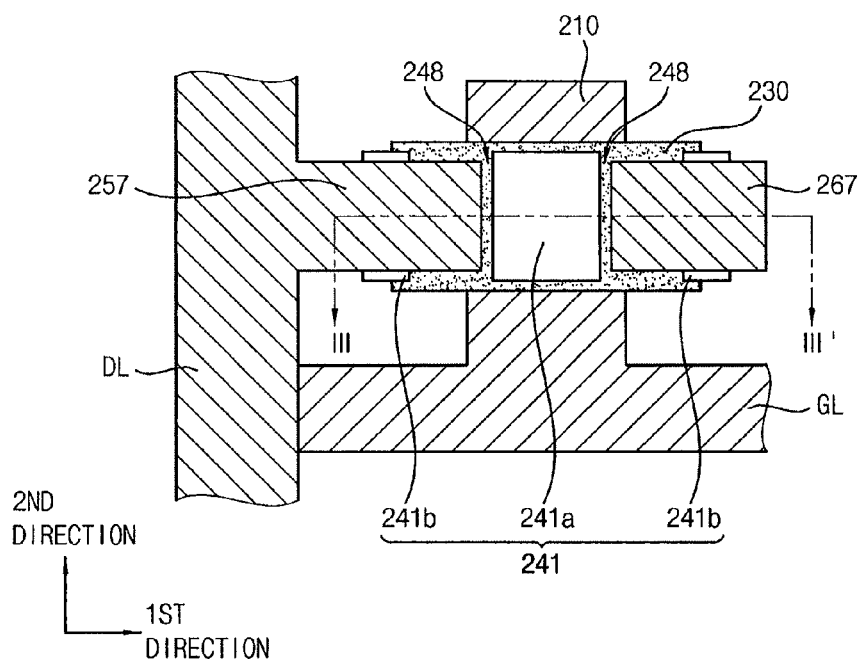
FIG. 15A illustrates a top plan view illustrating a TFT substrate in accordance with exemplary embodiments.
Figure 15B:
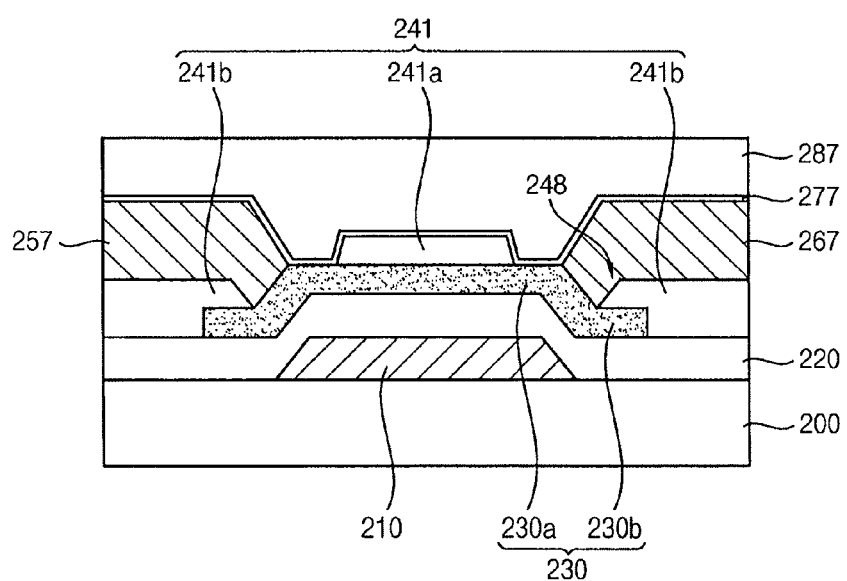
FIG. 15B illustrates a cross-sectional view taken along a line of III-III' FIG. 15A.

FIG. 15A illustrates a top plan view illustrating a TFT substrate in accordance with exemplary embodiments. FIG. 15B illustrates a cross-sectional view taken along a line III-III' of FIG. 15A.

The TFT substrate of FIGS. 15A and 15B may have a structure substantially the same as or similar to that of the TFT substrate illustrated in FIG. 8 except for a shape of an etch-stop layer pattern. Thus, detailed descriptions on elements and/or constructions substantially the same as or similar to those illustrated with reference to FIG. 8 are omitted. Further, like reference numerals are used to represent like elements. A method of manufacturing the TFT substrate is also described with reference to FIGS. 15A and 15B.

Referring to FIGS. 15A and 15B, an etch-stop layer pattern 241 may include a central portion 241a and a peripheral portion 241b which may be separated by an opening 248.

In example embodiments, processes substantially the same as or similar to those illustrated with reference to FIGS. 9 and 10 may be performed to form a gate electrode 210, a gate insulation layer 220 and an active pattern 230 on a base substrate 200. The gate insulation layer 220 and the active pattern 230 may have protruding portions according to a shape of the gate electrode 210. Alternatively, the gate insulation layer 220 and the active pattern 230 may have substantially even or leveled upper surfaces as illustrated in FIG. 1B.

An etch-stop layer covering the active pattern 230 may be formed on the gate insulation layer 220, and then the etch-stop layer may be partially etched to form the etch-stop layer pattern 241 including the central portion 241a and the peripheral portion 241b on the active pattern 230.

In example embodiments, a photo mask including an opening portion extending in the second direction may be formed on the etch-stop layer, and then the etch-stop layer may be partially etched using the photo mask. Accordingly, the central portion 241a and the peripheral portion 241b separated from each other may be formed, and the opening 248 may be defined between the central portion 241a and the peripheral portion 241b to extend in the second direction. A top surface of the active pattern 230 may be partially exposed by the opening 248. The opening 248 may have a substantially trench shape extending in the second direction.

As illustrated in FIG. 15B, when the active pattern 230 includes a protruding portion 230a and a planar portion 230b, the central portion 241a of the etch-stop layer pattern 241 may be formed on the protruding portion 230a to be superimposed over the gate electrode 210. The peripheral portion 241b of the etch-stop layer pattern 241 may be formed on the gate insulation layer 220 to cover the planar portion 230b of the active pattern 230.

A process substantially the same as or similar to that illustrated with reference to FIG. 12 may be performed to form a source electrode 257 and a drain electrode 267. The source and drain electrodes 257 and 267 may be formed on the peripheral portions 241b of the etch-stop layer pattern 241 to be in contact with both ends of the active pattern 230. When the active pattern 230 includes the protruding portion 230a and the planar portion 230b, the source electrode 257 and the drain electrode 267 may be in contact with lateral surfaces of the protruding portion 230a. In this case, the top surface of the protruding portion 230a may be exposed by the opening 248.

A process substantially the same as or similar to that illustrated with reference to FIG. 13 may be performed to form an inorganic barrier layer 277 and a planarization layer 287. The inorganic barrier layer 277 may be formed along the source electrode 257, the drain electrode 267, the etch-stop layer pattern 241 and the active pattern 230 exposed by the opening 248. A planarization layer 287 may be formed on the inorganic barrier layer 277 to sufficiently fill the opening 248.

Figure 16:
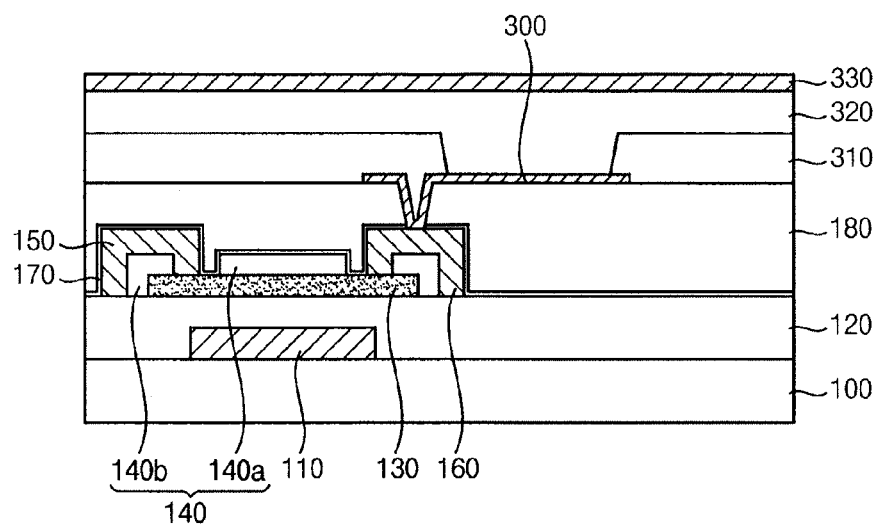

FIG. 16 illustrates a cross-sectional view illustrating a display device in accordance with example embodiments. For example, FIG. 16 illustrates an organic light emitting display (OLED) device including the TFT substrate in accordance with example embodiments. However, the TFT substrate may be employed to other display devices such as a liquid crystal display (LCD) device or a flexible display device. Detailed descriptions of elements and/or constructions substantially the same as or similar to those illustrated with reference to FIGS. 1A and 1B are omitted.

Referring to FIG. 16, the display device may include the TFT substrate and an organic light emitting structure electrically connected to the TFT substrate.

The TFT substrate may include a gate electrode 110, a gate insulation layer 120, an active pattern 130, an etch-stop layer pattern 140 having a central portion 140a and a peripheral portion 140b, a source electrode 150, a drain electrode 160, an inorganic barrier layer 170, and a planarization layer 180 disposed on a base substrate 100 as illustrated FIGS. 1A and 1B.

In exemplary embodiments, the TFT substrate may have structures substantially the same as or similar to those illustrated with reference to FIG. 8, FIGS. 14A and 14B, or FIGS. 15A and 15B.

The organic light emitting structure may be disposed on the TFT substrate. The organic light emitting structure may include a first electrode 300, a pixel defining layer (PDL) 310, an organic light emitting layer (EML) 320, and a second electrode 330.

The first electrode 300 may be electrically connected to the drain electrode 160 through the planarization layer 180 and the inorganic barrier layer 170. The first electrode 300 may include a transparent conductive material such as ITO, IZO, ZTO, tin oxide or zinc oxide, a metal such as Cr, Al, Ta, Mo, Ti, W, Cu, Ag or Nd, and/or an alloy of the metals. The first electrode 300 may serve as a pixel electrode and/or an anode of the display device. The planarization layer 180 may serve as a via layer for forming the first electrode 300.

The PDL 310 may be disposed on the planarization layer 180 to cover peripheral portions of the first electrode 300. The PDL 310 may define a pixel region of the display device, and a portion of the first electrode 300 not covered by the PDL 310 may substantially correspond to an area of the pixel region. The PDL 310 may include photosensitive material such as polyimide resin or acryl resin. Alternatively, the PDL 310 may include a non-photosensitive organic material or an inorganic material such as carbon black.

The EML 320 may be disposed on the pixel defining layer 310 and the first electrode 300 exposed by the pixel defining layer 310. In one example embodiment, a hole transport layer (HTL) (not illustrated) may be further disposed between the first electrode 300 and the EML 320.

The EML 320 may include at least one light emitting material for generating different colors of light, for example, a red color of light, a green color of light or a blue color of light. In exemplary embodiments, the EML 320 may include a mixture of the light emitting materials for generating a white color of light.

The HTL may include a hole transport material, for example, 4,4'-bis[N-(1-naphtyl)-N-phenylamino]biphenyl (NPB), 4,4'-bis[N-(3-methylphenyl)-N-phenylamino]biphenyl (TPD), N,N'-di-1-naphtyl-N,N'-diphenyl-1,1'-biphenyl-4,4'-diamine (NPD), N-phenylcarbazole, polyvinylcarbazole or a mixture thereof.

As illustrated in FIG. 16, the EML 320 may be formed continuously on surfaces of the PDL 310 and the first electrode 300. Alternatively, the EML 320 may be patterned in each pixel to be confined by sidewalls of the PDL 310.

The second electrode 330 may be disposed on the EML 320. The second electrode 330 may include a metal such as lithium (Li), calcium (Ca), lithium fluoride/calcium (LiF/Ca), LiF/Al, Al, Mg, Ag, Cr, W, Mo or Ti, or an alloy thereof. In one example embodiment, the second electrode 330 may include a transparent conductive material such as ITO, IZO, ZTO, tin oxide, or zinc oxide. The second electrode 330 may serve as a cathode of the display device.

The second electrode 330 may be formed continuously on a substantially entire surface of the display device to serve as a common electrode. Alternatively, the second electrode 330 may be patterned in each pixel. In this case, the second electrode 330 may be confined by the sidewalls of the PDL 310 together with the EML 320.

In one example embodiment, an electron transport layer (ETL) (not illustrated) may be further disposed between the second electrode 330 and the EML 320. The ETL may include an electron transport material, for example, tris(8-quinolinolato)aluminum (Alq3), 2-(4-biphenylyl)-5-4-tert-butylphenyl-1,3,4-oxadiazole (PBD), bis(2-methyl-8-quinolinolato)-4-phenylphenolato-aluminum (BAlq), bathocuproine (BCP), or a mixture thereof.

Additionally, a passivation layer, an optical sheet, a polarized film, and an upper transparent substrate may be optionally disposed on the second electrode 330.

FIGS. 17 to 21 illustrate cross-sectional views illustrating a method of manufacturing a display device in accordance with example embodiments.

Figure 17:
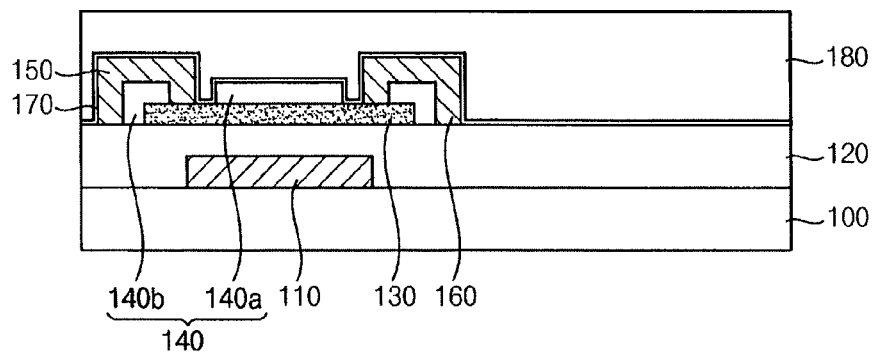

Referring to FIG. 17, processes substantially the same as or similar to those illustrated with reference to FIGS. 2 to 7 may be performed to form the TFT substrate in accordance with example embodiments. Accordingly, the TFT substrate may include a gate electrode 110, a gate insulation layer 120, an active pattern 130, an etch-stop layer pattern 140 including a central portion 140a and a peripheral portion 140b, a source electrode 150, a drain electrode 160, an inorganic barrier layer 170, and a planarization layer 180 formed on a base substrate 100.

In exemplary embodiments, the TFT substrate may be obtained by processes substantially the same as or similar to those illustrated with reference to FIGS. 9 to 13, FIGS. 14A and 14B, or FIGS. 15A and 15B.

Figure 18:
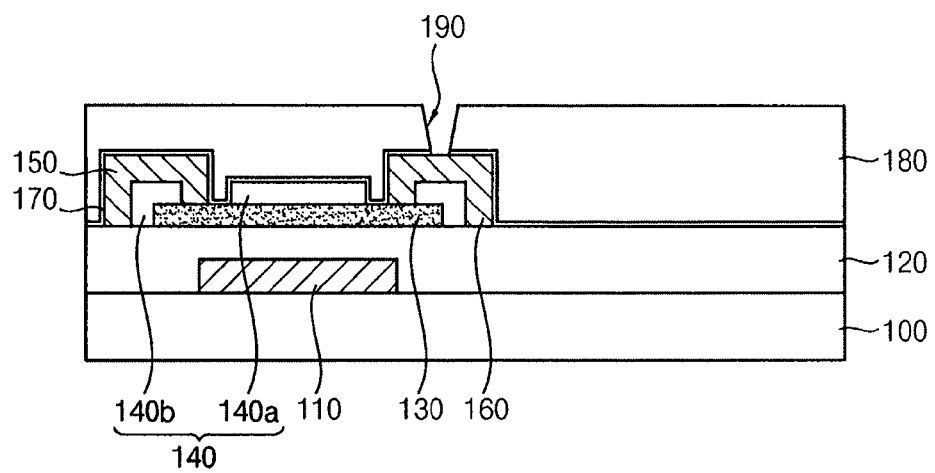

Referring to FIG. 18, the planarization layer 180 and the inorganic barrier layer 170 may be partially removed to form a via hole 190 partially exposing the drain electrode 160.

In example embodiments, the planarization layer 180 may be partially removed by, e.g., an exposure process and a developing process to form a preliminary via hole partially exposing the inorganic barrier layer 170. A portion of the inorganic barrier layer 170 exposed by the preliminary via hole may be removed by a dry etching process to form the via hole 190. For example, oxygen (O2), nitrogen (N2), and/or argon (Ar) gases may be utilized as an etching gas during the dry etching process. A fluorine containing gas such as CF3 or NF3 may be added to the etching gas.

In one example embodiment, the portion of the inorganic barrier layer 170 may be removed by a wet etching process. When the inorganic barrier layer 170 includes a metal oxide such as aluminum oxide or titanium oxide, the wet etching process may be performed using an etching solution that may have an etching selectivity for the metal oxide relative to a conductive material of the drain electrode 160. For example, the etching solution may include diluted hydrofluoric acid, hydrochloric acid, or sulfuric acid. The etching solution may include a mixture of diluted ammonia (NH3) and hydrogen peroxide (H2O2).

As described above, the inorganic barrier layer 170 may have a thickness less than about 200 Å. When the thickness of the inorganic barrier layer 170 exceeds about 200 Å, an etching amount and/or an etching time required to form the via hole 190 may be excessively increased, thereby resulting in damage to an upper surface of the planarization layer 180. Accordingly, the first electrode 300 formed on the planarization layer 180 may also include defects.

Figure 19:
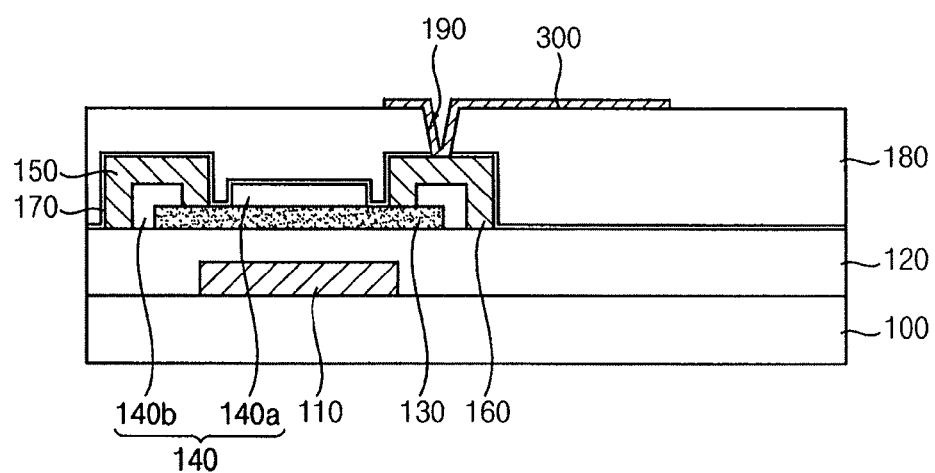

Referring to FIG. 19, the first electrode 300 may be formed on the upper surface of the planarization layer 180, a sidewall and a bottom surface of the via hole 190. Accordingly, the first electrode 300 may be in contact with the drain electrode 160 through the planarization layer 180 and the inorganic barrier layer 170.

In example embodiments, a conductive layer may be formed on the upper surface of the planarization layer 180, the sidewall and the bottom surface of the via hole 190, and then the conductive layer may be patterned to form the first electrode 300.

The conductive layer may be formed using a transparent conductive material ITO, IZO, ZTO, AZO, tin oxide or zinc oxide, a metal such as Cr, Al, Ta, Mo, Ti, W, Cu, Ag or Nd, and/or an alloy of the metals. The conductive layer may be obtained by a sputtering process, an ALD process, a vacuum evaporation process, or a printing process, etc. In one example embodiment, the conductive layer may completely fill the via hole 190.

Figure 20:
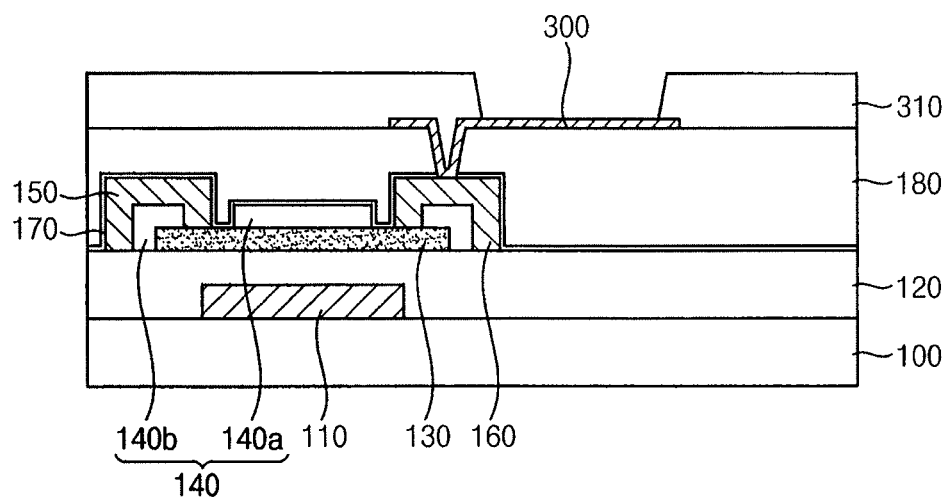

Referring to FIG. 20, a PDL 310 covering peripheral portions of the first electrode 300 may be formed on the planarization layer 180 to define a pixel region of the display device.

For example, a photosensitive material layer including, e.g., acryl resin, polyimide resin, or BCB may be formed on the planarization layer 180 and the first electrode 300. The photosensitive material layer may be patterned by an exposure process and a developing process to form the PDL 310. Alternatively, non-photosensitive organic or inorganic layers may be formed on the planarization layer 180 and the first electrode 300, and then the non-photosensitive organic or inorganic layers may be partially etched to form the PDL 310.

Figure 21:
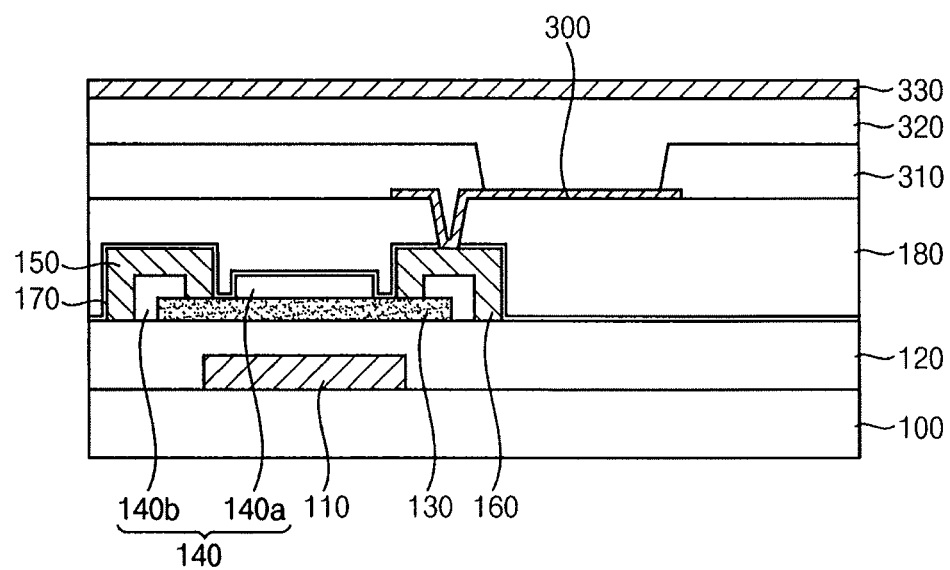

Referring to FIG. 21, an EML 320 and a second electrode 330 may be sequentially formed on the PDL 310 and the first electrode 300.

The EML 320 may be formed using at least one of light emitting materials for generating different colors of light, for example, a red color of light, a green color of light or a blue color of light. In one example embodiment, the EML 320 may be formed using a mixture of the light emitting materials for generating a white color of light. The EML 320 may be formed by a spin coating process, a roll printing process, a nozzle printing process, an inkjet printing process, or a transfer process using a donor substrate, etc.

The EML 320 may be formed continuously on surfaces of the PDL 310 and the first electrode 300 as illustrated in FIG. 21. Alternatively, the EML 320 may be patterned to be confined by sidewalls of the PDL 310.

In one example embodiment, an HTL may be further formed between the EML 320 and the first electrode 300 to include the above mentioned hole transport material. In one example embodiment, an ETL may be further formed on the EML 320 to include the above mentioned electron transport material. The HTL and the ETL may be formed by a spin coating process, a roll printing process, a nozzle printing process, an inkjet printing process, or a transfer process using a donor substrate, etc.

The second electrode 330 may be formed using a metal such as Li, Ca, LiF/Ca, LiF/Al, Al, Mg, Ag, Cr, W, Mo, or Ti, or an alloy thereof. In one example embodiment, the second electrode 330 may be formed using a transparent conductive material such as ITO, IZO, ZTO, AZO, tin oxide, or zinc oxide. The second electrode 330 may be obtained by a sputtering process, a CVD process, an ALD process, a vacuum evaporation process, or a printing process, etc.

The second electrode 330 may be formed continuously on a substantially entire surface of the display device. Alternatively, the second electrode 330 may be patterned in each pixel.

Additionally, a passivation layer, an optical sheet, a polarized film, and an upper transparent substrate may be optionally formed on the second electrode 330 to manufacture the display device.

By way of summation and review, amorphous silicon or polysilicon may be utilized as an active layer in a TFT. Recently, metal oxide semiconductors have been developed as the active layer to enhance charge mobility and uniformity of a threshold voltage at the active layer. As for the TFT, conductive layers and insulation layers may be stacked and generate a parasitic capacitance therebetween. In particular, source and drain electrodes may extend in an etch-stop layer pattern to overlap with a gate electrode. Thus, a parasitic capacitance generated between the electrode structures may be increased. Further, the active layer may be damaged during a process of forming the TFT, e.g., an etching process. Thus, a reduction of the parasitic capacitance and a reduction in damage to the active layer may be needed.

According to example embodiments, overlapping areas between electrode structures may be minimized so that a generation of a parasitic capacitance may be suppressed and a size of a TFT may be reduced. Additionally, a direct contact between an active pattern and a planarization layer may be avoided by an inorganic barrier layer so that a modification of the active pattern may be prevented. In this regard, in a TFT according to exemplary embodiments, source and drain electrodes may partially fill contact holes and may not extend to a central portion of an etch-stop layer pattern. Thus, overlapping areas between electrode structures may be minimized, so that a generation of a parasitic capacitance may be suppressed and a size of a TFT may be reduced. Additionally, a direct contact between an active pattern and a planarization layer may be avoided by an inorganic barrier layer, so that a modification of the active pattern may be prevented.

Exemplary embodiments provide a thin film transistor (TFT) substrate having a compact size and an excellent reliability.

Exemplary embodiments provide a display device including a TFT substrate having a compact size and an excellent reliability.

Exemplary embodiments provide a method of manufacturing a display device including a TFT substrate having a compact size and an excellent reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin film transistor substrate, comprising:
    a gate electrode on a base substrate, the gate electrode including at least two ends;
    a gate insulation layer covering the gate electrode on the base substrate;
    an active pattern on the gate insulation layer, the active pattern including an oxide semiconductor and being superimposed over the gate electrode;
    an etch-stop layer pattern including contact holes or openings through which the active pattern is partially exposed, the etch-stop layer pattern including a central portion and first and second peripheral portions, the first peripheral portion separated from the central portion by a first one of the contact holes or openings and the second peripheral portion separated from the central portion by a second one of the contact holes or openings, upper surfaces of the central portion and the first and second peripheral portions being substantially coplanar;

a source electrode and a drain electrode in contact with a portion of the exposed active pattern, the source electrode and the drain electrode being superimposed over respective ends of the gate electrode;

an inorganic barrier layer on the source electrode, the drain electrode, and the etch-stop layer pattern, the inorganic barrier layer including a metal oxide and being in direct contact with a remaining portion of the exposed active pattern; and a planarization layer directly on the inorganic barrier layer, the planarization layer including a transparent organic material, wherein the source electrode and the drain electrode partially fill the contact holes or the openings, the inorganic barrier layer is in contact with a bottom of a remaining portion of the contact holes or the openings, and the planarization layer fills the remaining portion of the contact holes or the openings.

2. The thin film transistor substrate as claimed in claim 1, wherein the active pattern includes an oxide semiconductor.

3. The thin film transistor substrate as claimed in claim 1, wherein the planarization layer includes a polyimide-based resin, a siloxane-based resin or benzo cyclobutene (BCB).

4. The thin film transistor substrate as claimed in claim 1, wherein the inorganic barrier layer includes aluminum oxide, titanium oxide, or a combination thereof.

5. The thin film transistor substrate as claimed in claim 1, wherein the source electrode and the drain electrode are on the first and second peripheral portions, respectively, of the etch-stop layer pattern and partially fill the contact holes or the openings.

6. The thin film transistor substrate as claimed in claim 5, wherein the source electrode and the drain electrode are not superimposed on the central portion of the etch-stop layer pattern.

7. The thin film transistor substrate as claimed in claim 1, wherein the inorganic barrier layer has a thickness ranging from about 50 521 to about 200 Å.

8. A display device, comprising:

a gate electrode on a base substrate, the gate electrode including at least two ends;

a gate insulation layer covering the gate electrode on the base substrate;

an active pattern on the gate insulation layer, the active pattern including an oxide semiconductor and being superimposed over the gate electrode;

an etch-stop layer pattern including contact holes or openings through which the active pattern is partially exposed, the etch-stop layer pattern including a central portion and first and second peripheral portions, the first peripheral portion separated from the central portion by a first one of the contact holes or openings and the second peripheral portion separated from the central portion by a second one of the contact holes or openings, upper surfaces of the central portion and the first and second peripheral portions being substantially coplanar;

a source electrode and a drain electrode in contact with a portion of the exposed active pattern, the source electrode and the drain electrode being superimposed over respective ends of the gate electrode;

an inorganic barrier layer on the source electrode, the drain electrode and the etch-stop layer pattern, the inorganic barrier layer including a metal oxide and being in direct contact with a remaining portion of the exposed active pattern;

a planarization layer directly on the inorganic barrier layer, the planarization layer including a transparent organic material;

a first electrode electrically connected to the drain electrode through the planarization layer and the inorganic barrier layer;

an organic light emitting layer on the first electrode; and a second electrode on the organic light emitting layer, wherein the source electrode and the drain electrode partially fill the contact holes or the openings, the inorganic barrier layer is in contact with a bottom of a remaining portion of the contact holes or the openings, and the planarization layer fills the remaining portion of the contact holes or the openings.

9. The display device as claimed in claim 8, wherein the planarization layer includes a polyimide-based resin, a siloxane-based resin or benzocyclobutene (BCB).

10. The display device as claimed in claim 9, wherein the inorganic barrier layer includes aluminum oxide, titanium oxide, or a combination thereof.

11. A method of manufacturing a display device, comprising:

forming a gate electrode on a base substrate, the gate electrode including at least two ends;

forming a gate insulation layer covering the gate electrode on the base substrate;

forming an active pattern on the gate insulation layer, the active pattern being formed of an oxide semiconductor and being superimposed over the gate electrode;

forming an etch-stop layer pattern partially covering the active pattern and including contact holes or openings through which the active pattern is partially exposed, the etch-stop layer pattern including a central portion and first and second peripheral portions, the first peripheral portion separated from the central portion by a first one of the contact holes or openings and the second peripheral portion separated from the central portion by a second one of the contact holes or openings, upper surfaces of the central portion and the first and second peripheral portions being substantially coplanar;

forming a source electrode and a drain electrode in contact with a portion of the active pattern exposed by the etch-stop layer pattern, the source electrode and the drain electrode being superimposed over both ends of the gate electrode and partially filling the contact holes or the openings;

forming an inorganic barrier layer on the source electrode, the drain electrode and the etch-stop layer pattern, the inorganic barrier layer being formed of a metal oxide, the inorganic barrier layer being in direct contact with a remaining portion of the exposed active pattern and in contact with a bottom of a remaining portion of the contact holes or the openings;

forming a planarization layer directly on the inorganic barrier layer to fill the remaining portion of the contact holes or the openings, the planarization layer being formed of a transparent organic material;

forming a first electrode on the planarization layer, the first electrode being electrically connected to the drain electrode through the planarization layer and the inorganic barrier layer;

forming an organic light emitting layer on the first electrode; and forming a second electrode on the organic light emitting layer.

12. The method as claimed in claim 11, wherein forming the etch-stop layer pattern includes:

forming an etch-stop layer covering the active pattern on the gate insulation layer; and partially etching the etch-stop layer to form the contact holes or the openings partially exposing the active pattern.

13. The method as claimed in claim 12, wherein forming the source electrode and the drain electrode includes:
   forming a first conductive layer filling the contact holes or the openings on the etch-stop layer pattern; and
   partially removing a portion of the first conductive layer formed in the contact holes or the openings.

14. The method as claimed in claim 11, wherein forming the first electrode includes:
   partially removing the planarization layer by an exposure process and a developing process to form a preliminary via hole;
   removing a portion of the inorganic barrier layer exposed by the preliminary via hole to form a via hole exposing the drain electrode;
   forming a second conductive layer on the planarization layer, sidewalls of the via hole, and a bottom surface of the via hole; and
   patterning the second conductive layer.

* * * * *